(12) United States Patent  
Ahn et al.

(10) Patent No.: US 7,915,725 B2  
(45) Date of Patent: Mar. 29, 2011

(54) SILICON WAFER FOR SEMICONDUCTOR WITH POWERSUPPLY SYSTEM ON THE BACKSIDE OF WAFER

(75) Inventors: Hyo-Jun Ahn, Jinju-si (KR); Ki-Won Kim, Jinju-si (KR); Jou-Hyeon Ahn, Jinju-si (KR); Tae-Hyun Nam, Jinju-si (KR); Kwon-Koo Cho, Jinju-si (KR); Hwi-Beom Shin, Jinju-si (KR); Hyun-Chil Choi, Busan (KR); Gyu-Bong Cho, Jinju-si (KR); Tae-Bum Kim, Busan (KR); Ho-Suk Ryu, Jinju-si (KR); Won-Cheol Shin, Jinju-si (KR); Jong-Seon Kim, Masan-si (KR)

(73) Assignee: Industry-Academic Cooperation Foundation Gyeongsang National University, Jinju-Si, Gyeongsangnam-Do (KR)

( * ) Notice: Subject to any disclaimer, the term of this patent is extended or adjusted under 35 U.S.C. 154(b) by 378 days.

(21) Appl. No.: 12/089,880

(22) PCT Filed: Oct. 13, 2006

(86) PCT No.: PCT/KR2006/004154  
§ 371 (c)(1),  
(2), (4) Date: Apr. 10, 2008

(87) PCT Pub. No.: WO2007/066886  
PCT Pub. Date: Jun. 14, 2007

(65) Prior Publication Data  
US 2008/0231345 A1  Sep. 25, 2008

(30) Foreign Application Priority Data

Dec. 5, 2005 (KR) .................. 10-2005-0117648

(51) Int. Cl.  
*H01L 23/52* (2006.01)  
(52) U.S. Cl. .......................... 257/691; 257/E23.153  
(58) Field of Classification Search .............. 257/691, 257/E23.153  
See application file for complete search history.

(56) References Cited

U.S. PATENT DOCUMENTS

| 4,855,613 A | 8/1989 | Yamada et al. |
| 5,874,782 A | 2/1999 | Palagonia |

FOREIGN PATENT DOCUMENTS

| EP | 1134808 | 9/2001 |
| KR | 101998003968 | 8/1998 |

*Primary Examiner* — David A Zarneke  
(74) *Attorney, Agent, or Firm* — Birch, Stewart, Kolasch & Birch, LLP

(57) ABSTRACT

Disclosed is a semiconductor silicon wafer having an electric power supply affixed to the backside of the wafer. By fabricating the electric power supply onto the backside of the wafer that has been left unused, the semiconductor chip can have a self-supplied power, realizing the self-powered semiconductor chip with an increased efficiency. Further, since the electric power supply is installed on the wafer, not the semiconductor chip, the fabrication procedure becomes very simple, and the battery can be mounted on any type of chip.

7 Claims, 3 Drawing Sheets

SILICON WAFER FOR SEMICONDUCTOR WITH POWERSUPPLY SYSTEM ON THE BACKSIDE OF WAFER

TECHNICAL FIELD

The present invention relates to a semiconductor silicon wafer with a built-in electric power supply on the backside. More specifically, the present invention relates to a semiconductor silicon wafer having an electric power supply affixed to the backside as a self-supplied power source for a semiconductor chip in a battery, so that power can be supplied within a semiconductor device.

BACKGROUND ART

A semiconductor chip currently used is operated by an external battery or AC power source. Even though there is a unit, in the semiconductor chip, which operates from an external power source, all necessary power for the semiconductor chip is entirely dependent on an external power source, and there is no self-supplied power source in the chip. If a self-supplied power source is available, it is usually used as a standard power source for both memory and non-memory semiconductor chips, a backup power source, and a standby power source. In particular, an active RFID, SOC (system on a chip)), LOC (lab. on a chip), solar battery, and so on make best use of the self-supplied power source. For now, only the concept of a thin film battery and its possible application as a power source for a semiconductor chip has been established, and there has not been any report on an internal power source of the semiconductor chip. Therefore, a need exists to develop a concept and system for embedding an electric power supply into a semiconductor chip, and especially to establish its fabrication process simple and easy to operate.

In case of a conventional semiconductor device, transistors, resistors, and capacitors are all built on the front side of a silicon wafer, leaving no specific function for its back side except for the use as a supporter.

An existing fabrication method of a thin-film battery involves patterning a battery area while the semiconductor process is under way, followed by deposition and etching. Unfortunately, the method is exposed to an increase of fabrication cost related to photo lithography and to a change in properties of semiconductor wafers due to heat budget from a battery material subjected to high-temperature heat treatment.

DISCLOSURE OF THE INVENTION

Technical Problem

In view of the foregoing problems, it is, therefore, an object of the present invention to provide a semiconductor wafer, especially a semiconductor silicon wafer, having an electric power supply affixed to its non-occupied (or non-utilized) backside as a self-supplied power source for a semiconductor chip in a battery, so that power can be supplied within a semiconductor device.

In other words, the invention is directed to provide a semiconductor silicon wafer having a built-in electric power supply on the backside thereof.

Technical Solution

In accordance with the present invention, there is provided a silicon wafer with an electric power supply affixed to its backside.

Preferably, the silicon wafer is a semiconductor silicon wafer.

With the electric power supply being affixed to the backside of a wafer, chips are now equipped with a power source built in situ, thereby enabling power to be supplied within a semiconductor device.

As an electric power source is affixed to the backside of a silicon wafer, when the wafer is diced into chips, each chip can be fabricated to a self-powered chip.

A wafer in this invention comprises any conventional wafer, preferably, a semiconductor wafer. Examples of a wafer in general include mono/multi crystal silicon wafers, GaAs wafers, and so on.

A term 'backside' in this invention refers to the backside of a wafer, that is, the opposite side of a front side on which transistors, capacitors, resistors, etc., are layered.

In this invention, an electric power source represents all systems that can store and convert electrical energy, for example, batteries, capacitors, fuel cells, and the like. Such an electric power supply is provided onto the backside of a wafer, singly or in combination of two or more.

In this invention, an electric power supply and a wafer (semiconductor device) are not separated from each other, but are disposed on opposite sides of a wafer (especially, a silicon substrate).

In this invention, a plug is used as a passage regulating electric power of a battery. The plug is formed by etching a contact hole from the front side of a semiconductor wafer and then filling up the hole with a metal. Examples of the metal include Cu, Ni, W, Ti, Ta, Pt, Ru, Au and so on.

Electricity charged in an electric power supply is fed to a power conversion device through a plug and further into semiconductor chips via 'Variable Power Circuit'. In other words, electricity is not supplied directly, but via the variable power circuit.

In this invention, (+) plug is connected to a cathode of a power conversion device and (−) plug is connected to an anode of the power conversion device. The power conversion device is then connected to a variable power circuit.

In this invention, a variable power circuit comprises a variable circuit converting voltage and current of an energy conversion device to a desired voltage and power; and an ESD (Electro Static Discharge) protection circuit protecting a semiconductor device.

In this invention, the battery, capacitor or fuel cell is any commercial battery, which consists of a cathode, an anode, electrolyte, and a protective coating. The battery can be built in any possible configuration, yet a solid state battery having the electrodes (a cathode and anode) and the electrolyte are all in solid state is preferred. Materials of such a battery are comprised of metals, ceramic, and polymer. In addition, a battery, capacitor and fuel cell may be built in a thin film type or have a 3 dimensional micro structure.

The inventive battery chemical composition is same as the chemical composition of a conventional battery. Preferred examples of such a battery include lithium batteries (lithium ion batteries, lithium polymer batteries, lithium-sulfur batteries, etc.), sodium batteries, alkaline batteries, Ni/MH batteries, Ni/Cd batteries and the like. As for a capacitor in the invention, any commercial capacitor inclusive of a super capacitor may be used.

A battery to be affixed to the backside of a silicon battery is manufactured by performing vacuum deposition or electrochemical plating processes on electrodes or insulating layers, collectors and so on. The vacuum deposition involves sputtering, chemical vapor deposition, evaporation, or other possible methods based on the use of plasma, laser and the like.

A battery consists of an insulating layer, an anode, an electrolyte, a cathode, and an insulating layer or protective film.

In order to supply power from an electric power supply mounted on a wafer backside to a semiconductor device, another aspect of the present invention provides a method for connecting a conducting wire in plug type to a cathode, anode or collector, by etching from the wafer front side to the wafer backside.

The electric power supply in this invention is charged with externally supplied electricity that flows in a power line formed along the contour of a semiconductor chip in 'power ring' shape, contouring to the inside of the semiconductor chip.

Moreover, the present invention suggests that semiconductor elements and an electric power supply be packaged with polyimide for the protective purpose.

The other objectives and advantages of the invention will be understood by the following description and will also be appreciated by the embodiments of the invention more clearly. Further, the objectives and advantages of the invention will readily be seen that they can be realized by the means and its combination specified in the claims.

As mentioned above and will be described below, when a wafer has a built-in electric power supply affixed to its backside, there is no need to carry out additional patterning processes on the battery. Therefore, the overall fabrication procedure becomes simplified and heat load budget can be reduced.

Further, because the inventive battery is manufactured in wafer level, it can be mounted on any type of chips. For example, the battery can be utilized in a various range of applications inclusive of a semiconductor device (memory/non-memory semiconductors), RFID, solar cell, SOC, LOC and the like.

DESCRIPTION OF DRAWINGS

The above and other objects and features of the present invention will become apparent from the following description of the preferred embodiments given in conjunction with the accompanying drawings, in which.

BEST MODE FOR THE INVENTION

Figure 1:
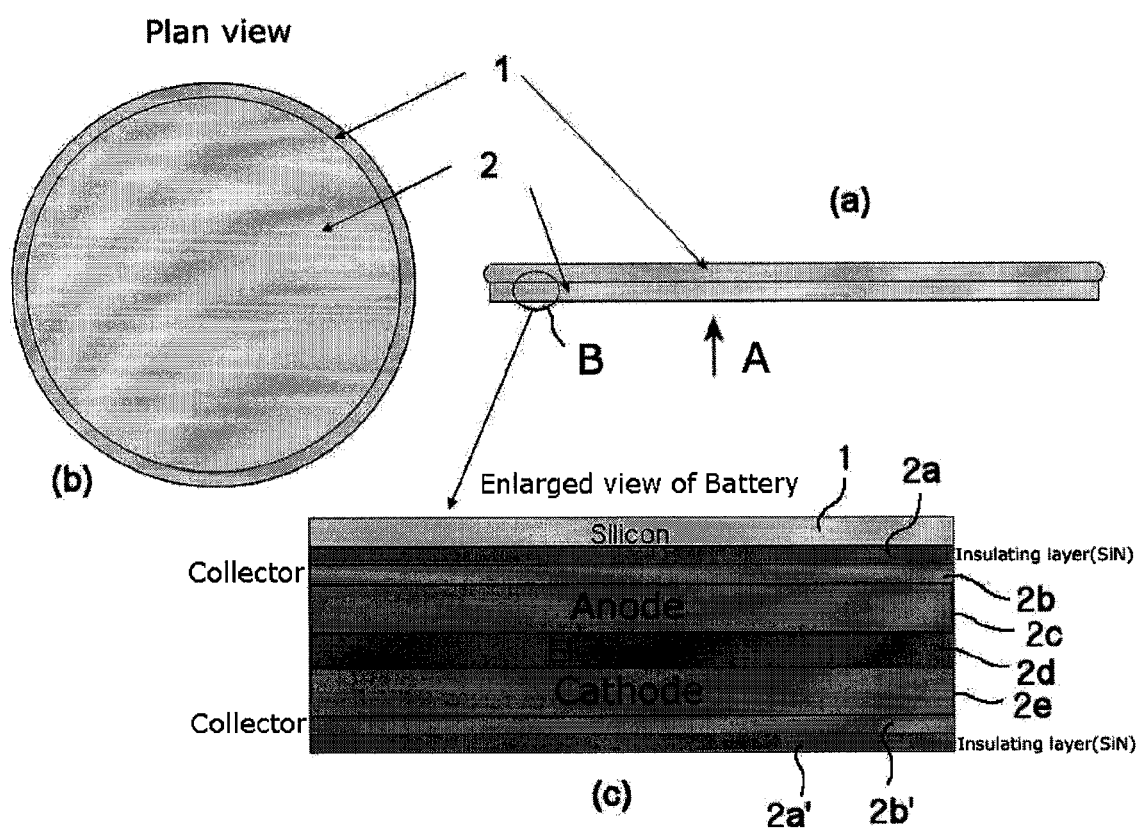
FIG. 1(a) illustrates a cross-sectional view of a silicon wafer designed to have an electric power supply on its backside by a thin-film process.
FIG. 1(b) is a plan view of the silicon wafer of FIG. 1(a) seen from the direction indicated by arrow "A".
FIG. 1(c) is an enlarged view of "B" portion of FIG. 1(a).

Hereinafter, preferred embodiments of the present invention will be set forth in detail with reference to the accompanying drawings.

FIG. 1(a) illustrates a cross-sectional view of a silicon wafer designed to have an electric power supply on its backside by a thin-film process; FIG. 1(b) is a plan view of the silicon wafer of FIG. 1(a) seen from the direction indicated by arrow A; and FIG. 1(c) is an enlarged view of "B" portion of FIG. 1(a).

As for the electric power supply 2, any commercial energy conversion and storage device that is capable of converting or storing electricity may be used. Examples of such a device include a secondary cell, a micro fuel cell, a capacitor and the like. This electric power supply may be installed on the backside of a wafer, singly or in combination of two or more. For instance, a secondary cell, a capacitor, and a micro fuel cell may be affixed onto the wafer backside singly or in combination of the secondary cell and the capacitor (or in combination of the micro fuel cell and the secondary cell) at the same time.

As is seen in FIG. 1(c), the electric power supply 2 may have a 3-layered structure consisting of three thin films of a cathode 2e, an anode 2c, and an electrolyte 2d, or a 3-dimensional micro structure consisting of bar-shaped electrodes and a solid electrolyte. At this time, the semiconductor device on the front side of the wafer should be electrically insulatable from the electric power supply 2, and ions involved in the electrochemical reaction in a battery must not move around. For this reason, insulating layers 2a and 2a' are deposited between the electric power supply and the front side of the semiconductor wafer. Any insulating, dense, crystalline substance may be utilized as the material of the insulating layers. Preferred examples of such substance include SiO, $SiO_2$, SiN, SiON and the like. Moreover, a collector is sandwiched between the insulating layer 2a and the anode 2c, and between the other insulating layer 2a' and the cathode 2e, respectively.

Figure 2:
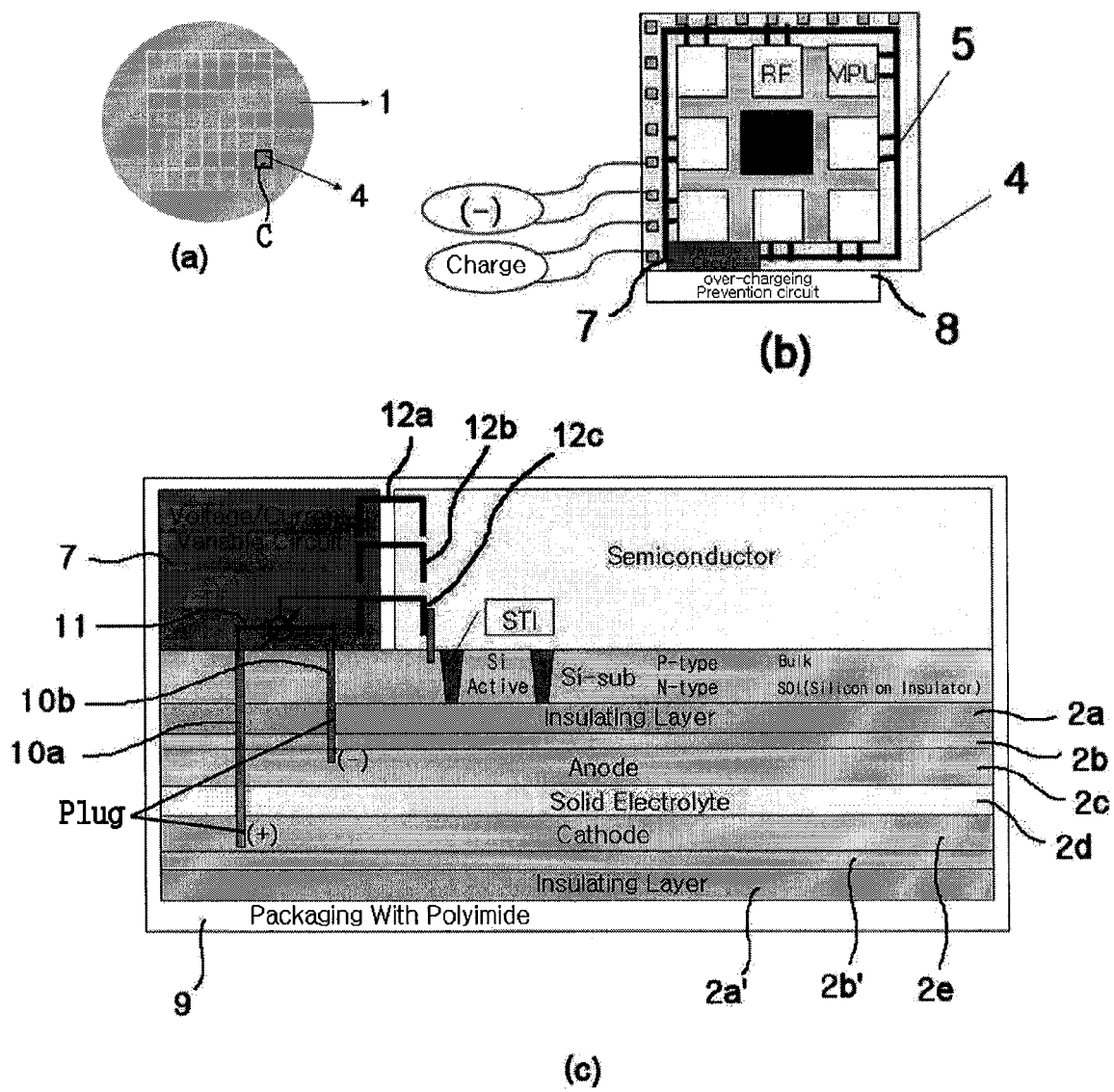
FIG. 2(a) is a plan view of a semiconductor chip diced from the wafer of FIG. 1.
FIG. 2(b) is an enlarged view of "C" portion of FIG. 2(a).
FIG. 2(c) is an enlarged view of "D" portion of FIG. 2(b).

FIG. 2(a) is a plan view of a semiconductor chip 4 diced from the wafer 1 of FIG. 1; FIG. 2(b) is an enlarged view of "C" portion of FIG. 2(a); and FIG. 2(c) is an enlarged view of "D" portion of FIG. 2(b).

The electric power supply 2 is coated with a protective coating to block the intrusion of moisture and air. To meet this purpose, SiO, $SiO_2$, SiN, SiON, polymer, oxide and the like are used as a substance of the protective coating. Once the semiconductor chip 4 is fabricated, it is packaged with a protective layer 9 made of polyimide and the like.

Plugs 10a and 10b are used as passages of electricity from the electric power supply 2 to the semiconductor chip 4. The plugs 10a and 10b are formed by etching contact holes from the front side of the semiconductor wafer 1, followed by filling up the holes with conductive substances, for example, pure metals, alloys, conductive polymers and so on. Any metal, especially Cu, Ni, W, Ti, Ta, Pt, Ru, Au, etc., capable of forming a metallic bond may be utilized.

A voltage/current variable circuit block 7 is provided to the front side of the semiconductor wafer as a passage of electricity form the electric power supply 2 into the semiconductor chip 4. The voltage/current variable circuit block 7 includes a power conversion device 11 and variable power circuits 12a, 12b, and 12c.

In detail, the power conversion device 11 connecting the cathode 2e and the anode 2c of the electric power supply 2 is installed in the voltage/current variable circuit block 7. Moreover, the (+) plug 10a is connected to the cathode of the electric power supply 11, while the (−) plug 10b is connected to the anode of the electric power supply 11. Then, the power conversion device 11 is connected to the variable power circuits 12a, 12b, and 12c. The variable power circuit consists of a variable circuit which serves to vary (or change) the voltage and current of an energy conversion device to a desired voltage and current; and an ESD (Electro Static Discharge) protection circuit which serves to protect a semiconductor device.

The following describes how to fabricate the electric power supply 2 onto the backside of the silicon wafer 1. At first, electrodes, insulating layers 2a and 2a', collectors 2b and 2b' and so on are prepared by vacuum deposition or electrochemical plating. The vacuum deposition involves sputtering, chemical vapor deposition, evaporation, or other possible methods based on the use of plasma, laser and the like.

At first, the insulating layers 2a and 2a' are deposited on the backside of the silicon wafer 1. At this time, the insulating layers 2a and 2a' are made of electrically insulating substances, e.g., SiN, $SiO_2$ and the like, and ions thereof must not move either. Next, the cathode collector 2b is deposited on the insulating layers 2a and 2a'. The collector is preferably made of electrically conductive materials such as aluminum, copper, gold, silver, etc. Then, the anode 2c is deposited on the cathode collector 2b. A typically used battery substance is fabricated in film form to function as the anode 2c. For example, a metal hydride electrode in a nickel-hydrogen battery, and a carbon electrode or lithium compound (lithium metal, lithium alloy and so on) in a lithium battery correspond to the anode 2c. Following the deposition of the anode 2c, the solid electrolyte 2d is deposited. The solid electrolyte 2d refers to an electrolyte in solid state, and is generally made of an inorganic based substance, e.g., LiPON, lithium oxide, nitride and the like, or made of a polymer electrolyte, e.g., PEO, PMMA and the like. The inorganic based electrolyte is deposited by conventional thin film deposition methods involving evaporation or electrochemical plating; while the polymer electrolyte is deposited by spin-coating. Next, the cathode 2e made of conventional anode materials including lithium oxide ($LiCoO_2$, $LiMnO_2$, etc.), lithium sulfides ($Li_2S$, $LiFeS_2$, etc.), sulfides ($FeS_2$, NiS, etc.), $Ni(OH)_2$ and the like is deposited On the electrolyte 2d.

Figure 3:
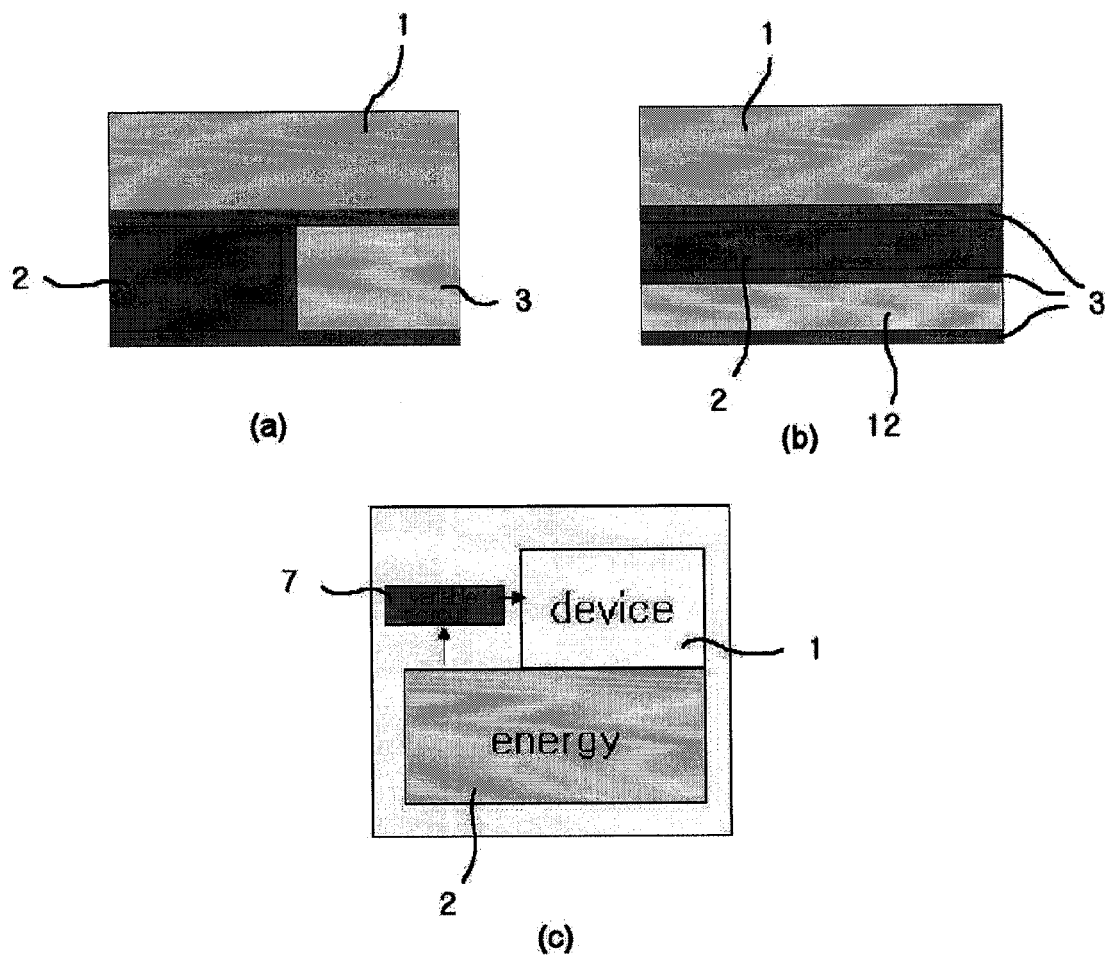
FIG. 3(a) illustrates a cross-sectional view of an example of a combined battery and capacitor used simultaneously.
FIG. 3(b) illustrates a cross-sectional view of another example of a combined battery and capacitor used simultaneously.
FIG. 3(c) shows roughly that energy moves, through a variable power circuit, from a silicon wafer having a built-in electric power supply affixed to its backside.

FIG. 3(a) illustrates a cross-sectional view of an example of the combined battery 2-1 and capacitor 2-2 used simultaneously; FIG. 3(b) illustrates a cross-sectional view of another example of a combined battery 2-1 and capacitor 2-2 used simultaneously; and FIG. 3(c) shows roughly that energy moves, through a variable power circuit, from the silicon wafer having a built-in electric power supply affixed to its backside.

In the invention, the battery 2-1 is coated with an insulating layer 3, and a capacitor 2-2 is then deposited thereon. Here, the battery 2-1 and the capacitor 2-2 are electrically connected via a plug. Alternatively, the battery 2-1 and the capacitor 2-2 may be layered sequentially (FIG. 3(b)).

If the semiconductor device requires a low power, the battery 2-1 may be used. On the other hand, if the semiconductor device requires a high power, the capacitor 2-2 may be used.

Meanwhile, a wire needs to be connected to supply power from the electric power supply 2 on the backside of the wafer 1 to the semiconductor element. This can be accomplished by etching from the front side of the wafer 1 to the backside of the wafer, and a conducting wire is connected to the cathode 2e, the anode 2c, or the collectors 2b and 2b' in plug form 10a and 10b (refer to FIG. 2(c)).

Especially, according to the present invention, the power from the backside of the wafer 1 is not supplied directly to the front side of the wafer 1, but goes via the voltage/current variable circuit block 7. Here, the variable circuit block 7 includes a circuit power conversion device 11 and a variable power circuit for varying voltage and current. When power is supplied from the variable circuit block 7 to the semiconductor device, power flows in a power line formed along the contour of a semiconductor chip 4 in 'power ring' 5 shape, contouring to the inside of the semiconductor chip 4. Moreover, the power ring is used for charging the electric power supply with externally provided electricity. This is because the variable circuit block and the (charging) PAD are bound together to the power ring. Meanwhile, although a high voltage may flow in the power ring during charge, the element does not break thanks to a special device located in the entrance of the element from the power ring.

In addition, according to the present invention, the semiconductor element and electric power supply 2 are packaged with a protective film (e.g., made of polymer like polyimide) for the protective purpose.

INDUSTRIAL APPLICABILITY

As explained so far, the present invention relates to a semiconductor silicon wafer having an electric power supply affixed to the backside of the wafer. By fabricating the electric power supply onto the backside of the wafer that has been left unused, the semiconductor chip can have a self-supplied power, realizing the self-powered semiconductor chip with an increased efficiency. Further, since the electric power supply is installed on the wafer, not the semiconductor chip, the fabrication procedure becomes very simple, and the battery can be mounted on any type of chip, whereby the invention can be advantageously used in electrical/electronics business.

The invention claimed is:

1. A semiconductor silicon wafer having an electric power supply affixed to the backside of the wafer.
2. The semiconductor silicon wafer of claim 1, comprising:
    a variable circuit block provided to the front side of the wafer for supplying power; and
    plugs connected from the electric power supply to the variable circuit block.
3. The semiconductor silicon wafer of claim 1, wherein the electric power supply is selected from a group consisting of a battery, a capacitor, and a fuel cell.
4. The semiconductor silicon wafer of claim 2, wherein the plug is formed by etching a contact hole from the front side of the wafer, and filling up the contact hole with a metal.
5. The semiconductor silicon wafer of claim 4, wherein the metal is selected from a group consisting of Cu, Ni, W, Ti, Ta, Pt, Ru, and Au.
6. The semiconductor silicon wafer of claim 2, wherein power supply from the variable circuit block is characterized in that power flows in a power line formed along the contour of a semiconductor chip in power ring shape, contouring to the inside of the semiconductor chip.
7. The semiconductor silicon wafer of one of claims 1 to 6, wherein the outside of the wafer is fully packaged with polyimide.

* * * * *